United States Patent
Wang et al.

(10) Patent No.: US 8,492,003 B2
(45) Date of Patent: Jul. 23, 2013

(54) HEAT SINKING ELEMENT AND METHOD OF TREATING A HEAT SINKING ELEMENT

(75) Inventors: Cheng-Chuan Wang, Changhua County (TW); Chia-Ying Yen, Changhua County (TW); Hsin-Hwa Chen, Taipei County (TW)

(73) Assignee: Industrial Technology Research Institute, Hsinchu (TW)

( * ) Notice: Subject to any disclaimer, the term of this patent is extended or adjusted under 35 U.S.C. 154(b) by 152 days.

(21) Appl. No.: 12/981,525

(22) Filed: Dec. 30, 2010

(65) Prior Publication Data

US 2012/0125577 A1   May 24, 2012

(30) Foreign Application Priority Data

Nov. 24, 2010   (TW) .............................. 99140576 A (51) Int. Cl.
*B32B 15/20* (2006.01)
*F28F 21/08* (2006.01)
*H05K 7/20* (2006.01)
*C25D 11/18* (2006.01)

(52) U.S. Cl.
USPC ............. 428/472.2; 428/315.5; 361/710; 174/548; 257/712; 205/324; 205/223

(58) Field of Classification Search
None
See application file for complete search history.

(56) References Cited

U.S. PATENT DOCUMENTS

| | | | | |
|---|---|---|---|---|
| 4,251,330 A | * | 2/1981 | Sheasby et al. | 205/173 |
| 5,334,297 A | * | 8/1994 | Nakada et al. | 205/118 |
| 7,384,792 B1 | * | 6/2008 | Wang et al. | 436/165 |
| 7,531,120 B2 | | 5/2009 | Van Rijn et al. | |
| 2006/0243997 A1 | * | 11/2006 | Yang et al. | 257/98 |
| 2007/0289874 A1 | * | 12/2007 | Masuda et al. | 205/171 |
| 2010/0258445 A1 | * | 10/2010 | Arurault et al. | 205/222 |
| 2010/0307579 A1 | * | 12/2010 | Sheng et al. | 136/256 |
| 2011/0287926 A1 | * | 11/2011 | Lalman et al. | 502/5 |

FOREIGN PATENT DOCUMENTS

| | | |
|---|---|---|
| CN | 1997271 | 7/2007 |
| CN | 101626674 | 1/2010 |
| JP | 2008141097 | 6/2008 |
| TW | I257281 | 6/2006 |
| TW | 200815727 | 4/2008 |
| TW | 200831845 | 8/2008 |
| TW | 200909343 | 3/2009 |
| TW | I317415 | 11/2009 |
| TW | I318789 | 12/2009 |
| TW | I322940 | 4/2010 |
| TW | 201024398 | 7/2010 |

OTHER PUBLICATIONS

Translation of TW 2008-15727. Apr. 2008.*
"Office Action of Taiwan Counterpart Application", issued on Nov. 14, 2012, p. 1-p. 5.

* cited by examiner

*Primary Examiner* — John J Zimmerman
(74) *Attorney, Agent, or Firm* — Jianq Chyun IP Office (57) ABSTRACT

A heat sinking element and a method of treating a heat sinking element are provided. The heat sinking element includes a metal substrate. The metal substrate is mainly composed of aluminium. A surface of the metal substrate has a plurality of micro-nano holes and a diameter of the micro-nano holes is smaller than 300 nm. The method of treating a heat sinking element includes performing an oxidation process and an etching process on the metal substrate so as to form the plurality of micro-nano holes.

14 Claims, 7 Drawing Sheets

HEAT SINKING ELEMENT AND METHOD OF TREATING A HEAT SINKING ELEMENT

CROSS-REFERENCE TO RELATED APPLICATION

This application claims the priority benefit of Taiwan application serial no. 99140576, filed on Nov. 24, 2010. The entirety of the above-mentioned patent application is hereby incorporated by reference herein and made a part of this specification.

TECHNICAL FIELD

The disclosure relates to a heat sinking element with a passive cooling design.

BACKGROUND

In recent years, due to the progressive development of the LED (Light Emitting Diode) semiconductor technique, the luminescence efficiency of chips has been greatly improved and the applications are found in all fields e.g. from a projector pen to illumination applications, and thus the application range has been greatly expanded. Furthermore, the LED has the advantages of small volume, long lifespan, low pollution, and low cost, has optical characteristics of good color saturation and dynamic color control and so on. Therefore, the LED based techniques attract more attentions.

In general, the most well-known advantages of the LED as compared with the conventional light source are power-saving, environmental friendly and small size. Also, with the presence of an AC driven LED, the LED illumination system is more competitive in use. However, a thermal problem of the LED is still one of the major subjects in the development of the LED technique. The common heat sinking methods of the LED may be classified into an active cooling type and a passive cooling type.

The Active Cooling

A forced-air or forced-liquid heat exchanging medium is used to increase the heat exchange quantity with thermoelectric coupling materials in a unit time, thereby realizing heat sinking. The design methods in practice include (1) An air cooling type: a forced convection between a cool air and a heat source is conducted under the guidance of a fan and a duct to increase the heat exchange quantity and thus reduce the temperature of the LED. However, the EMI (Electromagnetic Interference) generated by the fan and the impact of vibration of the fan may adversely affect the reliability of the chip. (2) A water cooling type: a water flow and a heat exchange quantity are increased by using a pump and a pipe to reduce the temperature of the chip, which has a simple and effective configuration, but the EMI generated by the pump, an expansion and contraction of a coolant, and a leakage problem should be noted. (3) A thermal-electric coupling type: based on the characteristic of a thermal-electric coupling effect of the semiconductor, a cold end of a thermoelectric cooling chip supplied with an electrical energy to reduce the temperature of the LED module, which has the defect of power consumption.

The Passive Cooling

A natural convection, conduction, and radiation manners are boosted with a physical structure to conduct the heat exchange. This manners have been widely applied in the design of a heat slug of an electronic device and is the most economical and durable design.

SUMMARY OF THE DISCLOSURE

A heat sinking element is introduced herein, which has a plurality of micro-nano holes to facilitate a heat dissipation behaviour.

A method of treating a heat sinking element is introduced herein to enhance the heat dissipation behaviour of the heat sinking element.

A heat sinking element is introduced in the disclosure, which includes a metal substrate. The metal substrate is mainly composed of aluminium. A surface of the metal substrate has a plurality of micro-nano holes and a diameter of the micro-nano holes is smaller than 300 nm.

A method of treating a heat sinking element is further introduced in the disclosure. Firstly, a metal substrate is provided, in which the metal substrate is mainly composed of aluminium. Then, an oxidation process is performed on a surface of the metal substrate, and an etching process is performed to form a plurality of micro-nano holes on the surface of the metal substrate, in which a diameter of the micro-nano holes is smaller than 300 nm.

As embodied and broadly described herein, in an embodiment of the disclosure, an oxidation process and an etching process are performed on a surface of a metal substrate to form a heat sinking element. Therefore, the surface of the metal substrate has a plurality of micro-nano holes, thereby significantly increasing the surface area. In this manner, the thermal resistance of the heat sinking element is significantly lowered and the heat dissipation behaviour may be effectively improved. Therefore, the heat sinking element in an embodiment of the disclosure when applied in the heat dissipation design of an LED chip or other chips can provide an effective heat dissipation function.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1:
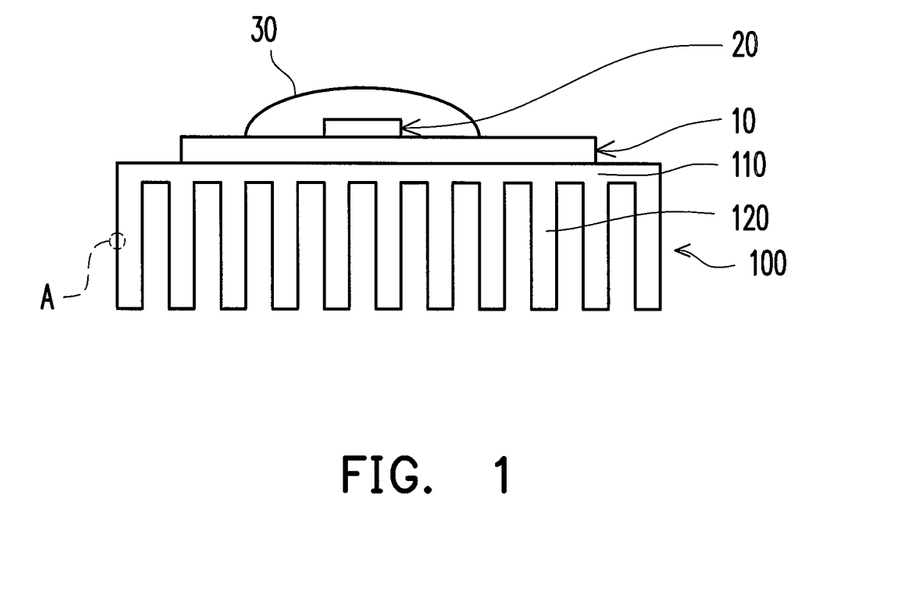
FIG. 1 illustrates a usage of a heat sinking element according to an embodiment of the disclosure.

FIG. 1 illustrates a usage of a heat sinking element according to an embodiment of the disclosure. Referring to FIG. 1, a heat sinking element 100 is, for example, configured on one side of a substrate 10, and the other side of the substrate 10 is, for example, configured with a chip 20. The chip 20 is further covered by a polymer colloid 30. The chip 20 in FIG. 1 is, for example, an LED chip, but the disclosure is not limited to this and the chip 20 may also be other driving chip. In addition, the heat sinking element 100, for example, includes a seat 110 and a plurality of fins 120 connected to the seat 110, but in other embodiments of the disclosure, the heat sinking element 100 may also be a slug without the fins 120. That is, the heat sinking element 100 in FIG. 1 is only exemplary but not intended to limit the shape thereof.

The chip 20 and the heat sinking element 100 are respectively configured on two opposite sides of the substrate 10, so the heat sinking element 100 will not block the chip 20. When the chip 20 is the LED chip, the chip 20 may emit light to provide a light source. In general, the chip 20 generates a certain amount of heat in operation, if the heat cannot be dissipated, the chip 20 is damaged. Therefore, the heat sinking element 100 is disposed to transfer the heat generated by the chip 20 to the outside in a manner of conduction and convection, so as to avoid that the chip 20 cannot work properly under a high temperature.

Figure 2A:
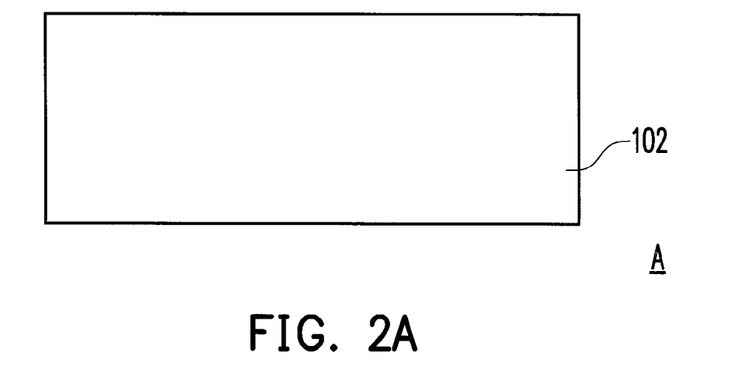
FIG. 2A to FIG. 2C illustrate a method of treating the heat sinking element of FIG. 1, and FIG. 2A to FIG. 2C are partial enlarged schematic views illustrating a region A in FIG. 1 only.
Figure 2B:
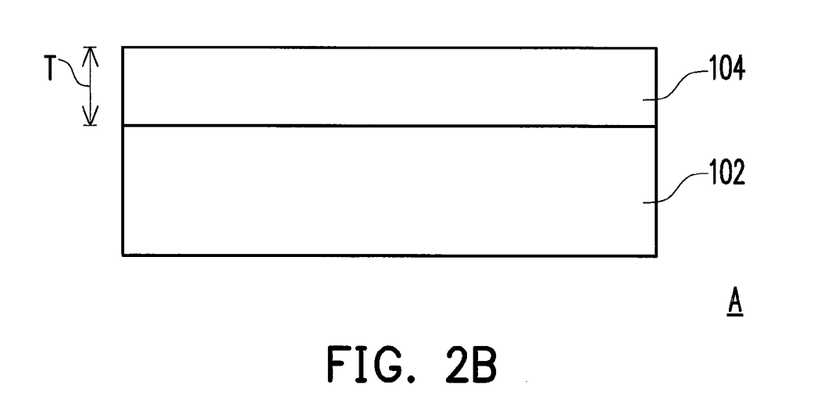
Figure 2C:
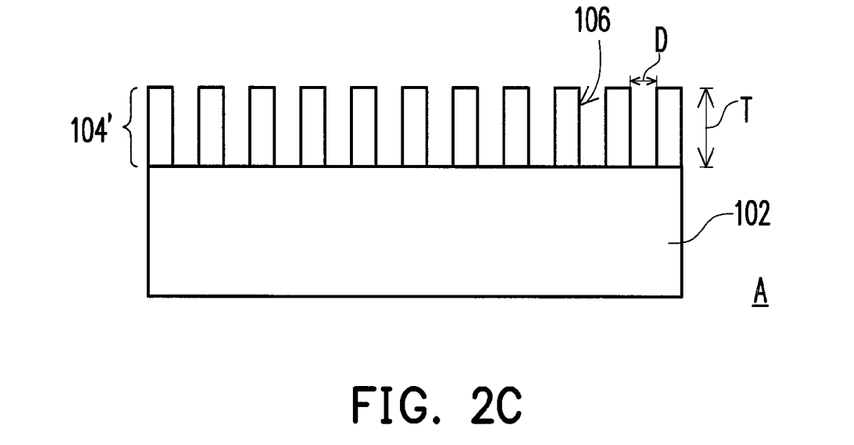

In details, in order to improve the heat dissipation behaviour of the heat sinking element 100, the heat sinking element 100 in an embodiment of the disclosure, for example, is subjected to the following treating processes. FIG. 2A to FIG. 2C illustrate a method of treating the heat sinking element of FIG. 1, and FIG. 2A to FIG. 2C are partial enlarged schematic views illustrating a region A in FIG. 1 only. Firstly, referring to FIG. 2A, a metal substrate 102 is provided, and the metal substrate 102 is mainly composed of aluminium. In an embodiment, a material of the metal substrate 102 includes aluminium or an aluminium alloy, or another metal material with a good heat conductivity. Furthermore, before performing the subsequent steps, the metal substrate 102, for example, is subjected to oil-removal, degreasing, and relevant cleaning steps to make the surface of the metal substrate 102 present a fresh and clean state.

Then, referring to FIG. 2B, an oxidation process is performed on the surface of the metal substrate 102. In an embodiment, the method for performing an oxidation process on the surface of the metal substrate 102 includes oxidizing the surface of the metal substrate 102 with an aqueous solution of sulfuric acid, oxalic acid, or any combination thereof so as to form a metal oxidation layer 104. Furthermore, in the step of performing the oxidation process on the metal substrate 102, an electrochemical oxidation method may be adopted, in which the settings of parameters like a voltage and a current may be adjusted according to different requirements. In this manner, a thickness T of the metal oxidation layer 104 is determined by the control of the processing conditions. For example, a thickness T of the metal oxidation layer 104 is smaller than about 15 µm, or is ranging from about 3 µm to about 15 µm, or is ranging from about 5 µm to about 10 µm.

In addition, the material of the metal oxidation layer 104 includes aluminium oxide, aluminium oxide compound, or any combination thereof. Furthermore, the metal oxidation layer 104 is formed by directing oxidizing the surface of the metal substrate 102 instead of additionally coating or depositing on the surface of the metal substrate 102. When the material of the metal substrate 102 is aluminium, the metal material of the oxidation layer 104 may be aluminium oxide, aluminium sulphate, or aluminium oxalate etc. When the material of the metal substrate 102 is an Al—Mg alloy, the material of the metal oxidation layer 104 may be a combination of aluminium oxide and magnesium oxide, a combination of aluminium sulphate and magnesium sulphate, or a combination of aluminium oxalate and magnesium oxalate, etc. In other words, the material of the metal oxidation layer 104 is determined depending on the material of the metal substrate 102 and the type of the aqueous solution used in the oxidation step.

Thereafter, referring to FIG. 2C, an etching process is performed to form a plurality of micro-nano holes 106 on the surface of the metal substrate 102. In an embodiment, the etching solution used in the etching process includes an aqueous solution of sulfuric acid, oxalic acid, phosphoric acid, or any combination thereof. Now, the metal oxidation layer 104 in FIG. 2B after etching becomes a metal oxidation layer 104' having a plurality of micro-nano holes 106. In this step, the parameters of the etching process may be adjusted according to different requirements so that a diameter D of the micro-nano holes 106 is smaller than 300 nm. In specific, the diameter D of the micro-nano holes 106 may be ranging from 5 nm to 300 nm or from 20 nm to 80 nm.

Figure 3A:
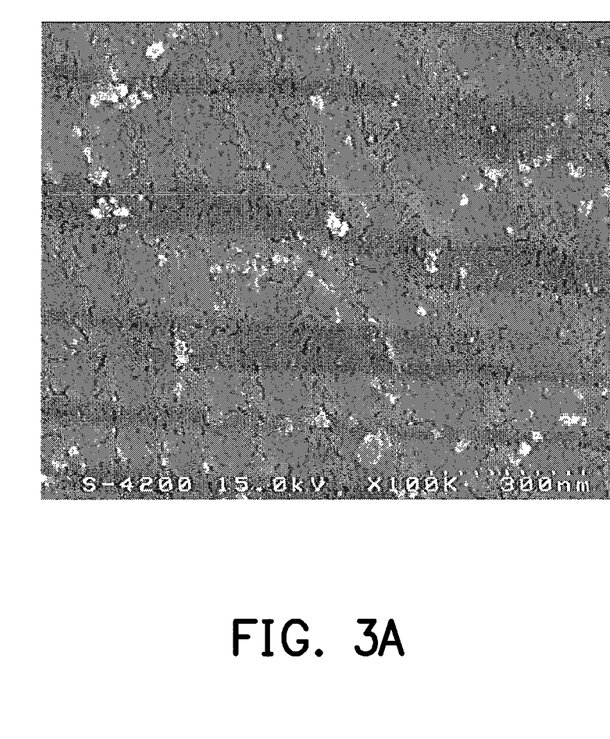
FIG. 3A and FIG. 3B are micrographs showing a metal substrate of a heat sinking element before and after a treatment respectively according to an embodiment of the disclosure.
Figure 3B:
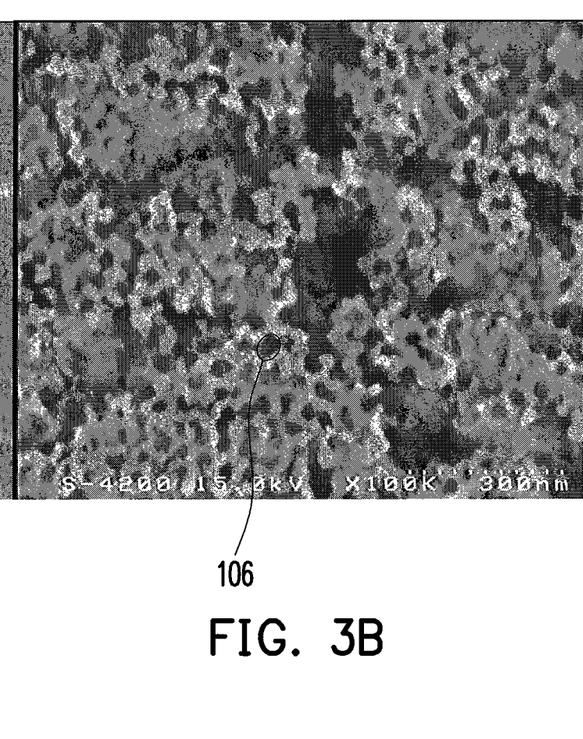

FIG. 3A and FIG. 3B are micrographs showing a metal substrate of a heat sinking element before and after a treatment respectively according to an embodiment of the disclosure. Referring FIG. 3A and FIG. 3B together, it can be clearly seen from the two micrographs that the surface in FIG. 3B obviously has a plurality of micro-nano holes 106. At the same time, the micro-nano holes 106 are formed by for example directly damaging the surface of the metal oxidation layer, so the micro-nano holes are closed holes in appearance. After the micro-nano holes 106 are formed, the surface area of the heat sinking element is obviously increased to facilitate the improvement of the heat dissipation behaviour. The performance of the heat dissipation behaviour of the heat sinking element in an embodiment of the disclosure will be illustrated in several manners hereinafter.

Figure 4:
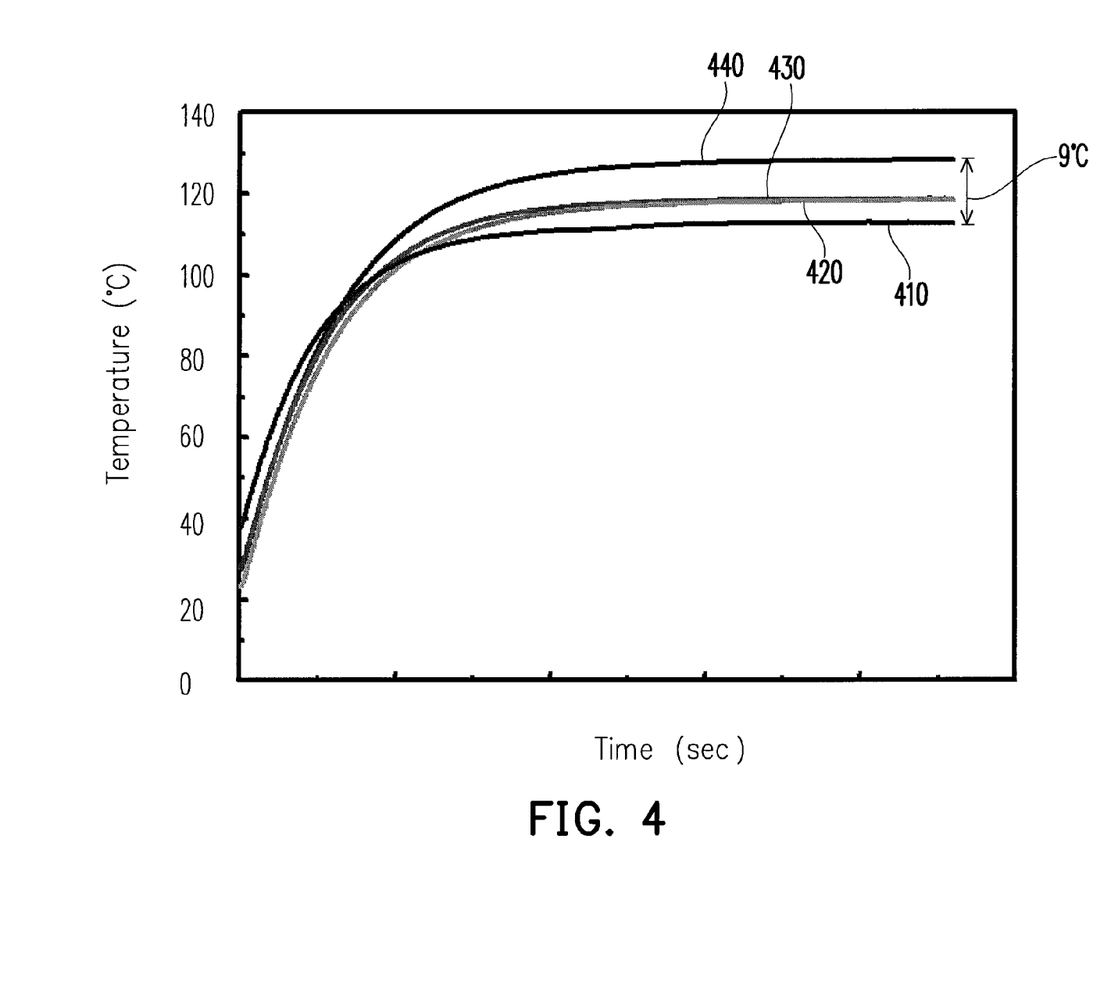
FIG. 4 illustrates a relationship between a temperature measured on a junction of a substrate and a heat sinking element and time when several types of heat sinking elements with the same dimension are applied in the usage of FIG. 1.

FIG. 4 illustrates a relationship between a temperature measured on a junction of a substrate and a heat sinking element and time when several types of heat sinking elements with the same dimension are applied in the usage of FIG. 1. Referring to FIG. 4, the behaviours indicated by a curve 410~a curve 440 are, for example, presented by the heat sinking element composed of aluminium. The curve 410 indicates the relationship of a temperature measured on a junction of a substrate and a heat sinking element and time when the heat sinking element according to an embodiment of the disclosure is applied in the usage of FIG. 1. That is to say, the curve 410 indicates the heat dissipation behaviour of the heat sinking element with a plurality of micro-nano holes formed on the surface thereof. The curve 420 indicates the relationship of a temperature measured on a junction of a substrate and a heat sinking element and time when the heat sinking element with an aluminium nitride coating applied on the surface thereof is applied in the usage of FIG. 1. The curve 430 indicates the relationship of a temperature measured on a junction of a substrate and a heat sinking element and time when the heat sinking element with a diamond-like carbon layer applied on the surface thereof is applied in the usage of FIG. 1. The curve 440 indicates the relationship of a temperature measured on a junction of a substrate and a heat sinking element and time when the heat sinking element with an untreated surface is applied in the usage of FIG. 1.

After the heat sinking element goes through the treating method of the oxidation and etching processes according to an embodiment of the disclosure, the heat sinking element can provide a better heat dissipation effect. Therefore, it can be known from the curve 410 that after a period of time, the temperature measured on the junction of the substrate and the heat sinking element in the curve 410 is 9° C. lower than the temperature in the curve 440. In addition, it can be known from the curve 420 and the curve 430 that the heat dissipation effect of the heat sinking element formed with the aluminium nitride coating or the diamond-like carbon layer is not as good as the effect presented by the curve 410. That is to say, as compared with other surface treating method, in the treating method of the embodiment of the disclosure, a plurality of micro-nano holes formed on the surface of the heat sinking element can significantly improve the heat dissipation capability of the heat sinking element, which further guarantees the overall product quality.

Figure 5:
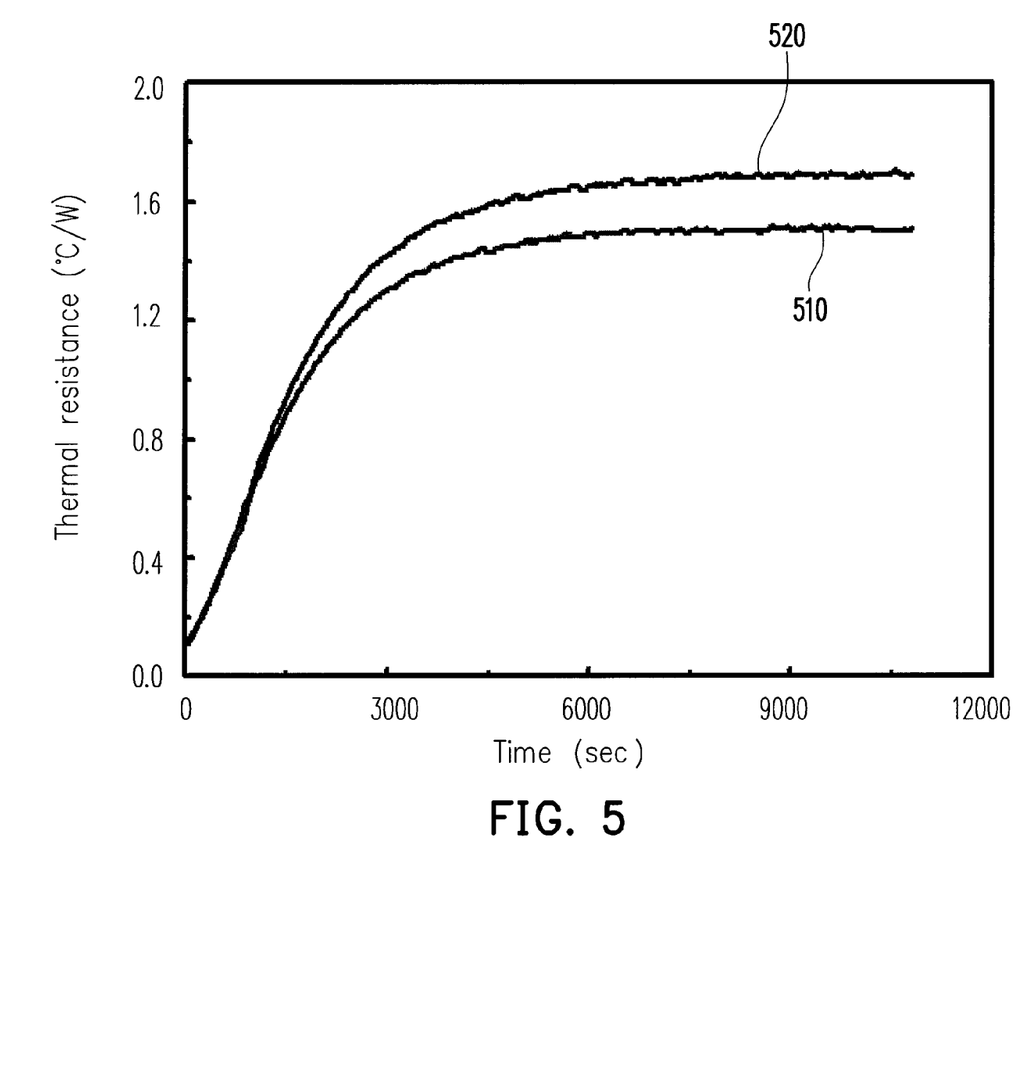
FIG. 5 illustrates a relationship between a thermal resistance of the heat sinking element and time in the usage of FIG. 1.

In general, the heat dissipation behaviour of one device may be represented by the thermal resistance. The thermal resistance is defined to be a value obtained after subtracting an ambient temperature from a junction temperature of the chip and then dividing by an input power. The value of the thermal resistance is used as the standard for judging the heat dissipation capability of the entire product. A larger thermal resistance value indicates that a poor heat dissipation capability. On the contrary, a smaller thermal resistance value indicates a good thermal resistance value indicates.

nano holes on the surface thereof) according to an embodiment of the disclosure when applied in the usage of FIG. 1. A curve 520 indicates the relationship between a thermal resistance and time presented by the heat sinking element with the untreated surface when applied in the usage of FIG. 1. It can be clearly known from the curve 510 and the curve 520 that the thermal resistance presented by the heat sinking element having a plurality of micro-nano holes according to an embodiment of the disclosure is obviously lower than the thermal resistance of the heat sinking element with the untreated surface. Therefore, it is known that the heat sinking element according to an embodiment of the disclosure has a better heat dissipation capability.

Figure 6:
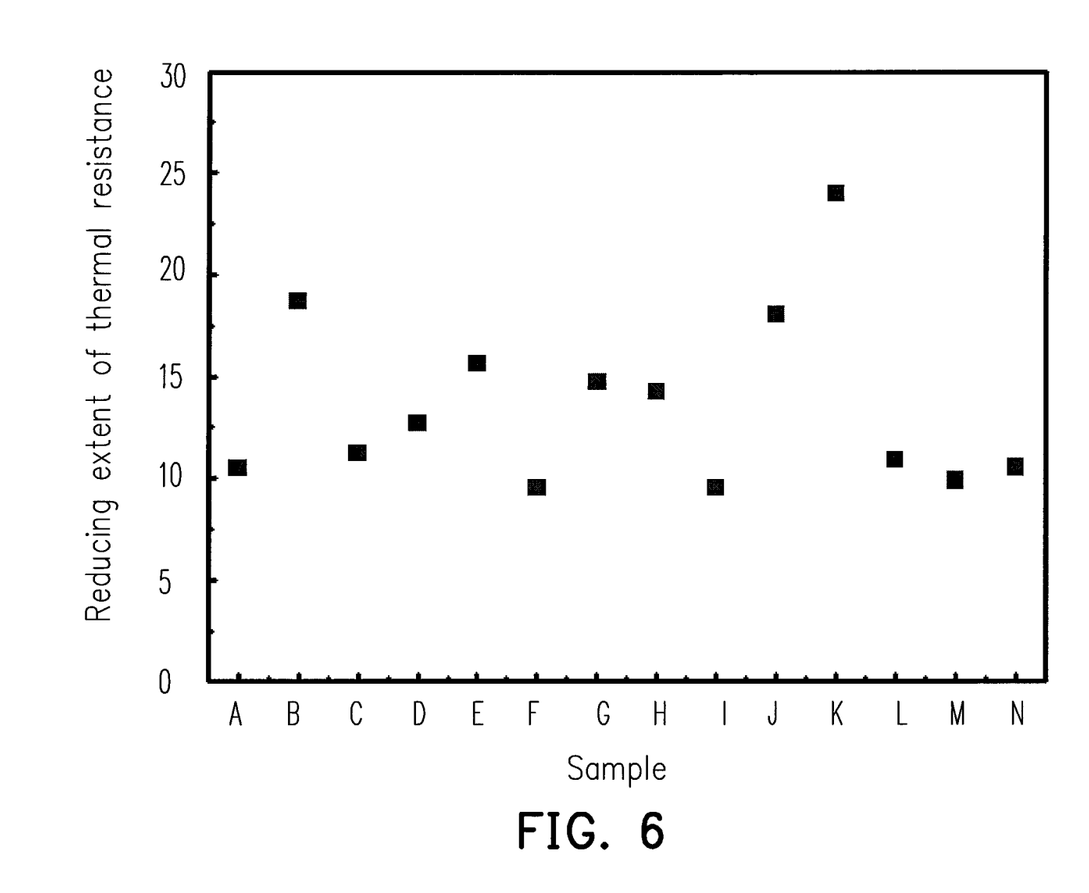
FIG. 6 illustrates a thermal resistance variation extent of the heat sinking element after treated by the treating method according to an embodiment of the disclosure.

Furthermore, FIG. 6 illustrates a thermal resistance variation extent of the heat sinking element after treated by the treating method according to an embodiment of the disclosure. Referring to FIG. 6, the transverse axis indicates the samples after treatment under different processing conditions and the longitudinal axis indicates the reducing extent of the thermal resistance of the samples after treatment as compared with the untreated samples. In FIG. 6, each of sample A~sample N has the same dimension but the oxidation and etching processes are performed under different processing conditions. In addition, the reducing extent of the thermal resistance of each sample after treatment is calculated by the formula of $(1-R_i/R_o) \times 100\%$, where $R_o$ is the thermal resistance of the untreated heat sinking element and $R_i$ is the thermal resistance of one of sample A~sample N.

Table 1 lists the reducing extent of the thermal resistance and the processing conditions of sample A~sample N.

TABLE 1

| SAMPLE | REDUCING EXTENT OF THE THERMAL RESISTANCE $1 - R_i/R_o) \times 100\%$ | ELECTROCHEMICAL OXIDATION | | | ETCHING | |
|---|---|---|---|---|---|---|
| | | SOLUTION | VOLTAGE | TIME | SOLUTION | TIME |
| A | 10.53 | 10% sulfuric acid | 18 V | 5 minutes | 5% phosphoric acid | 5 minutes |
| B | 18.72 | 10% sulfuric acid | 18 V | 10 minutes | 5% phosphoric acid | 10 minutes |
| C | 11.22 | 10% sulfuric acid | 18 V | 15 minutes | 5% phosphoric acid | 10 minutes |
| D | 12.69 | 10% sulfuric acid | 18 V | 30 minutes | 5% phosphoric acid | 10 minutes |
| E | 15.61 | 10% sulfuric acid | 18 V | 30 minutes | 5% phosphoric acid | 20 minutes |
| G | 14.69 | 10% sulfuric acid | 18 V | 15 minutes | 5% phosphoric acid | 5 minutes |
| H | 14.22 | 10% sulfuric acid | 18 V | 30 minutes | 5% phosphoric acid | 15 minutes |
| I | 9.51 | 2.7 wt % oxalic acid | 40 V | 10 minutes | 5% phosphoric acid | 5 minutes |
| J | 18.07 | 2.7 wt % oxalic acid | 40 V | 15 minutes | 5% phosphoric acid | 5 minutes |
| K | 23.94 | 2.7 wt % oxalic acid | 40 V | 20 minutes | 5% phosphoric acid | 5 minutes |
| L | 10.92 | 2.7 wt % oxalic acid | 40 V | 20 minutes | 5% phosphoric acid | 10 minutes |
| M | 9.90 | 2.7 wt % oxalic acid | 40 V | 10 minutes | 5% phosphoric acid | 5 minutes |
| N | 10.54 | 2.7 wt % oxalic acid | 40 V | 15 minutes | 5% phosphoric acid | 10 minutes |

FIG. 5 illustrates a relationship between a thermal resistance of the heat sinking element and time in the using manner of FIG. 1. Referring to FIG. 5, a curve 510 indicates the relationship between a thermal resistance and time presented by the heat sinking element (formed with a plurality of micro- Overall, from FIG. 6 and Table 1, it is known that regardless the treating conditions, the thermal resistance variation extent of the heat sinking element with a plurality of micro-nano holes formed on the surface thereof after the oxidation process and the etching process is at least reduced by about 10% as compared with the status before treatment, and especially the thermal resistance of the sample K is reduced by 23.94%. Therefore, FIG. 6 and Table 1 may further illustrate that the heat sinking element with a plurality of micro-nano holes after being treated according to the method of an embodiment of the disclosure actually has a better heat dissipation capability.

Figure 7:
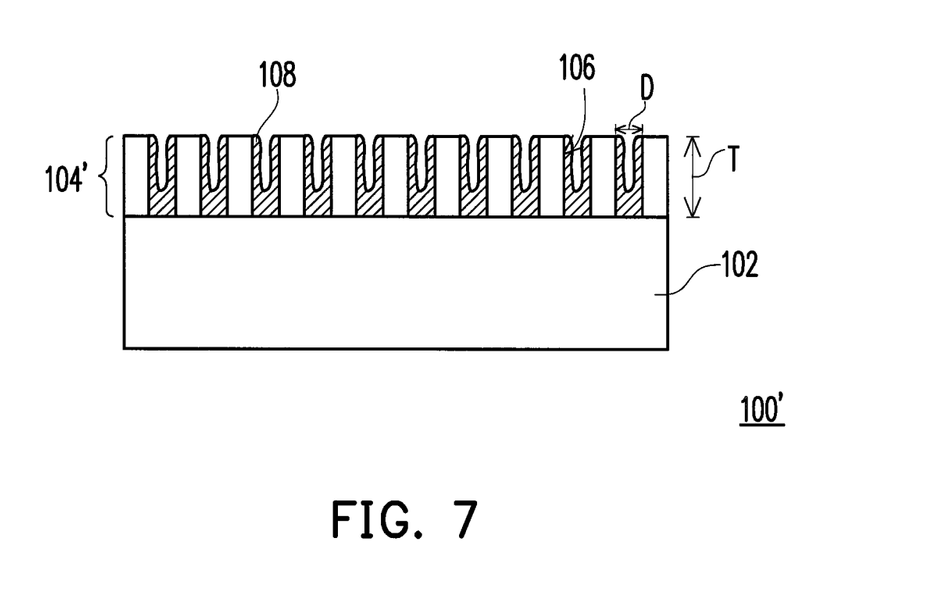
FIG. 7 is a partial schematic view illustrating a heat sinking element according to another embodiment of the disclosure.

Furthermore, FIG. 7 is a partial schematic view illustrating a heat sinking element according to another embodiment of the disclosure. Referring to FIG. 7, the substrate 102 of the heat sinking element 100' after being treated by the method of the above embodiment, for example, is formed with a metal oxidation layer 104'. The metal oxidation layer 104' has a plurality of micro-nano holes 106. Furthermore, in this embodiment, a plating process is further performed on the heat sinking element 100' to fill a plurality of nano metals 108 in the micro-nano holes 106. The nano metals 108 may optionally fully fill the micro-nano holes 106 or partially fill the micro-nano holes 106 in FIG. 7. In an embodiment, the heat sinking element 100' further formed with the nano metals 108 after the plating process may have an ideal heat dissipation effect.

For example, based on the experimental result, after going through an electrochemical process using 10% sulfuric acid for 30 minutes under the 18V voltage, an etching process using 5% phosphoric acid for 15 minutes, and then a plating process using an aqueous solution of sulfuric acid and potassium permanganate for 3 minutes, the reducing extent of the thermal resistance $(1-Ri/Ro)\times 100\%$ of the heat sinking element 100' is about 20%. In addition, after going through an electrochemical process using 10% sulfuric acid for 30 minutes under the 18V voltage, an etching process using 5% phosphoric acid for 15 minutes, and then a plating process using an aqueous solution of silver nitrate and magnesium sulphate for 5 minutes, the reducing extent of the thermal resistance $(1-Ri/Ro)\times 100\%$ of the heat sinking element 100' is about 14.8%. Therefore, it is known that the plating process additionally performed after the treating method of FIG. 2A to FIG. 2C helps to improving the heat dissipation capability of the heat sinking element 100'. Here, the material of the nano metal 108 includes one selected from a group consisting of Ni, Cu, Pd, Ag, Au, Pt, Co, Sn, Cr, Zn, Fe, Mo, Cd, Se, and any alloy thereof.

In summary, after the heat sinking element is treated by the method of an embodiment of the disclosure, the surface of the heat sinking element is formed with a plurality of micro-nano holes. In this manner, the surface area of the heat sinking element is significantly increased, which helps to improving the heat dissipation capability of the heat sinking element. In details, the treating method in an embodiment of the disclosure includes performing an oxidation and etching step, so the surface of the heat sinking element may be formed with a metal oxidation layer and the micro-nano holes are distributed in the metal oxidation layer. In addition, the processing conditions of the oxidation process and the etching process may determine the thickness of metal oxidation layer and a diameter of the micro-nano holes. Therefore, the surface structure of the heat sinking element in an embodiment of the disclosure can be controlled by a certain processing conditions. In this manner, the heat dissipation capability of the heat sinking element can be greatly improved, thereby improving the reliability of the product.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A heat sinking element, comprising:
   a metal substrate, consisting essentially of aluminium, and comprising a seat and a plurality of fins connected to the seat, wherein a surface of the metal substrate has a plurality of micro-nano holes and a diameter of the micro-nano holes is smaller than 300 nm; and
   a plurality of nano metals filled in the micro-nano holes.

2. The heat sinking element according to claim 1, wherein a material of the metal substrate is aluminium or an aluminium alloy.

3. The heat sinking element according to claim 1, wherein the surface of the metal substrate is formed with a metal oxidation layer and the metal oxidation layer has the micro-nano holes.

4. The heat sinking element according to claim 3, wherein a thickness of the metal oxidation layer is smaller than 15 μm.

5. The heat sinking element according to claim 3, wherein a thickness of the metal oxidation layer is ranging from 3 μm to 15 μm.

6. The heat sinking element according to claim 3, wherein a thickness of the metal oxidation layer is ranging from 5 μm to 10 μm.

7. The heat sinking element according to claim 3, wherein a material of the metal oxidation layer includes aluminium oxide, aluminium oxide compound, or any combination thereof.

8. The heat sinking element according to claim 1, wherein a diameter of the micro-nano holes is ranging from 5 nm to 300 nm.

9. The heat sinking element according to claim 1, wherein a diameter of the micro-nano holes is ranging from 20 nm to 80 nm.

10. The heat sinking element according to claim 1, wherein a material of the nano metals comprises at least one selected from a group consisting of Ni, Cu, Pd, Ag, Au, Pt, Co, Sn, Cr, Zn, Fe, Mo, Cd, Se and any alloy thereof.

11. A method of treating a heat sinking element, comprising:
    providing a metal substrate which consisting essentially of aluminium and comprising a seat and a plurality of fins connected to the seat;
    performing an oxidation process on a surface of the metal substrate; and
    performing an etching process on the surface of the metal substrate to form a plurality of micro-nano holes, wherein a diameter of the micro-nano holes is smaller than 300 nm; and
    filling a plurality of nano metals in the micro-nano holes.

12. The method of treating a heat sinking element according to claim 11, wherein a method for performing the oxidation process on the surface of the metal substrate comprises oxidizing the surface of the metal substrate with an aqueous solution of sulfuric acid, oxalic acid, or any combination thereof.

13. The method of treating a heat sinking element according to claim 11, wherein an etching solution used in the etching process comprises an aqueous solution of sulfuric acid, oxalic acid, phosphoric acid, or any combination thereof.

14. The method of treating a heat sinking element according to claim 11, further comprising performing a plating process to form the plurality of nano metals filled in the micro-nano holes.

* * * * *